US012284802B2

(12) United States Patent
Cui et al.

(10) Patent No.: US 12,284,802 B2
(45) Date of Patent: Apr. 22, 2025

(54) SEMICONDUCTOR STRUCTURE AND METHOD FOR MANUFACTURING SEMICONDUCTOR STRUCTURE

(71) Applicant: CHANGXIN MEMORY TECHNOLOGIES, INC., Hefei (CN)

(72) Inventors: Zhaopei Cui, Hefei (CN); Bingyu Zhu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 382 days.

(21) Appl. No.: 17/650,985

(22) Filed: Feb. 14, 2022

(65) Prior Publication Data

US 2022/0320109 A1 Oct. 6, 2022

Related U.S. Application Data

(63) Continuation of application No. PCT/CN2021/111835, filed on Aug. 10, 2021.

(30) Foreign Application Priority Data

Mar. 31, 2021 (CN) .................. 202110350105.X

(51) Int. Cl.
 *H01L 27/108* (2006.01)
 *H10B 12/00* (2023.01)
(52) U.S. Cl.
 CPC ........... *H10B 12/482* (2023.02); *H10B 12/30* (2023.02)
(58) Field of Classification Search
 CPC ............................. H10B 12/482; H10B 12/30
 See application file for complete search history.

(56) References Cited

U.S. PATENT DOCUMENTS

| 2020/0381435 A1* | 12/2020 | Choi | H10B 12/00 |
| 2021/0066304 A1* | 3/2021 | Kang | G11C 7/18 |
| 2022/0173108 A1* | 6/2022 | Lee | H01L 23/53266 |

FOREIGN PATENT DOCUMENTS

| CN | 106711145 B | 5/2017 |
| CN | 108878442 A | 11/2018 |
| CN | 111354711 A | 6/2020 |
| CN | 113097148 A | 7/2021 |
| JP | 2001094070 A | 4/2001 |

OTHER PUBLICATIONS

International Search Report cited in PCT/CN2021/111835, mailed Jan. 5, 2022, 9 pages.

\* cited by examiner

*Primary Examiner* — Mohammed R Alam

(74) *Attorney, Agent, or Firm* — Kilpatrick Townsend & Stockton LLP

(57) ABSTRACT

The present disclosure relates to a method for manufacturing a semiconductor structure, the method includes: a substrate is provided; a bit line array is formed on an upper surface of the substrate, the bit line array includes several bit lines arranged at intervals, the bit lines are connected through at least one support pattern, and the at least one support pattern penetrates through the bit line array along an arrangement direction of the bit lines; a bit line side wall is formed on side walls of each of the bit lines; a part of the at least one support pattern is removed so as to expose at least one sacrificial layer; and the at least one sacrificial layer is removed, so as to form at least one air gap between the first side wall dielectric layers and the second side wall dielectric layers.

9 Claims, 10 Drawing Sheets

SEMICONDUCTOR STRUCTURE AND METHOD FOR MANUFACTURING SEMICONDUCTOR STRUCTURE

CROSS-REFERENCE TO RELATED APPLICATION

This is a continuation of International Application No. PCT/CN2021/111835, filed on Aug. 10, 2021, which claims the priority to Chinese Patent Application No. 202110350105.X, filed to the China National Intellectual Property Administration on Mar. 31, 2021 and entitled "Semiconductor Structure and Method for Manufacturing Semiconductor Structure". The disclosures of International Application No. PCT/CN2021/111835 and Chinese Patent Application No. 202110350105.X are incorporated herein by reference in their entireties.

TECHNICAL FIELD

The present disclosure relates to the technical field of semiconductor manufacturing, and in particular, to a semiconductor structure and a method for manufacturing the semiconductor structure.

BACKGROUND

With the development of semiconductor technology, semiconductor devices are developing towards high speed, high integration density and low power consumption.

According to Moore's Law, the structure size of a semiconductor device has become increasingly miniaturized, particularly in the process of manufacturing a semiconductor device with a line width less than 1×. Along with the increasing integration degree of a semiconductor device, the main factor limiting the speed of the semiconductor device is no longer transistor delay, but is resistor-capacitor (Rc) delay associated with interconnection of conductive materials (e.g., metal). Specifically, with regard to a dynamic random access memory (DRAM), the memory generally has a storage cell array, the storage cell array comprises a plurality of storage cells arranged in an array, and the memory also has a plurality of bit lines, each bit line is respectively electrically connected to a corresponding storage cell, and the memory further includes a storage capacitor, the storage capacitor is configured to store electric charges representing store information, and the storage cells can be electrically connected to the storage capacitor through contact plugs, thereby achieving storage functions of the storage cells. As described above, with continuous decrease of the size of a semiconductor and increase of the arrangement density of semiconductor elements, at this time, correspondingly, for example, a large parasitic effect may exist between adjacent bit lines, between adjacent contact plugs, and so on, thereby affecting the performance of the device. Therefore, how to reduce a parasitic capacitance caused by the interconnection of conductive materials has become one of key factors limiting the development of semiconductor devices.

SUMMARY

According to various embodiments of the present disclosure, a semiconductor structure and a method for manufacturing the semiconductor structure are provided.

Some embodiments of the present disclosure provide a method for manufacturing a semiconductor structure, the method for manufacturing the semiconductor structure includes the following steps:
a substrate is provided;
a bit line array on an upper surface of the substrate is formed, the bit line array comprises several bit lines arranged at intervals, the bit lines are connected through at least one support pattern, and the at least one support pattern penetrates through the bit line array along an arrangement direction of the bit lines;
a bit line side wall on side walls of each of the bit lines, the bit line side wall comprises a first side wall dielectric layer, a sacrificial layer and a second side wall dielectric layer which are stacked in sequence from inside to outside, and the bit line side wall and the bit line form a bit line structure;
a part of the at least one support pattern is removed so as to expose at least one sacrificial layer; and
the at least one sacrificial layer is removed, so as to form at least one air gap between the first side wall dielectric layers and the second side wall dielectric layers.

Some embodiments of the present disclosure further provide a semiconductor structure, the semiconductor structure includes:
a substrate;
several bit lines arranged in parallel at intervals, each of the bit lines extends along a second direction; and
bit line side walls, each of the bit line side walls locates on side walls of one of the bit lines, and at least one of the bit line side walls includes a first side wall dielectric layer, an air gap and a second side wall dielectric layer which are stacked in sequence from inside to outside; each of the bit line side walls and one of the bit lines together constitute a bit line structure; and at least one recess each of the at least one is formed on an upper edge of the air gap.

BRIEF DESCRIPTION OF THE DRAWINGS

In order to illustrate the technical solutions of the embodiments of the present disclosure or conventional techniques more clearly, hereinafter, accompanying drawings requiring to be used in the description of the embodiments or conventional techniques will be briefly introduced. Apparently, the accompanying drawings in the following description merely relate to some embodiments of the present disclosure, and for a person of ordinary skill in the art, other accompanying drawings can also be obtained according to these accompanying drawings without involving any inventive effort.

DESCRIPTION OF REFERENCE SIGNS

Figure 1:
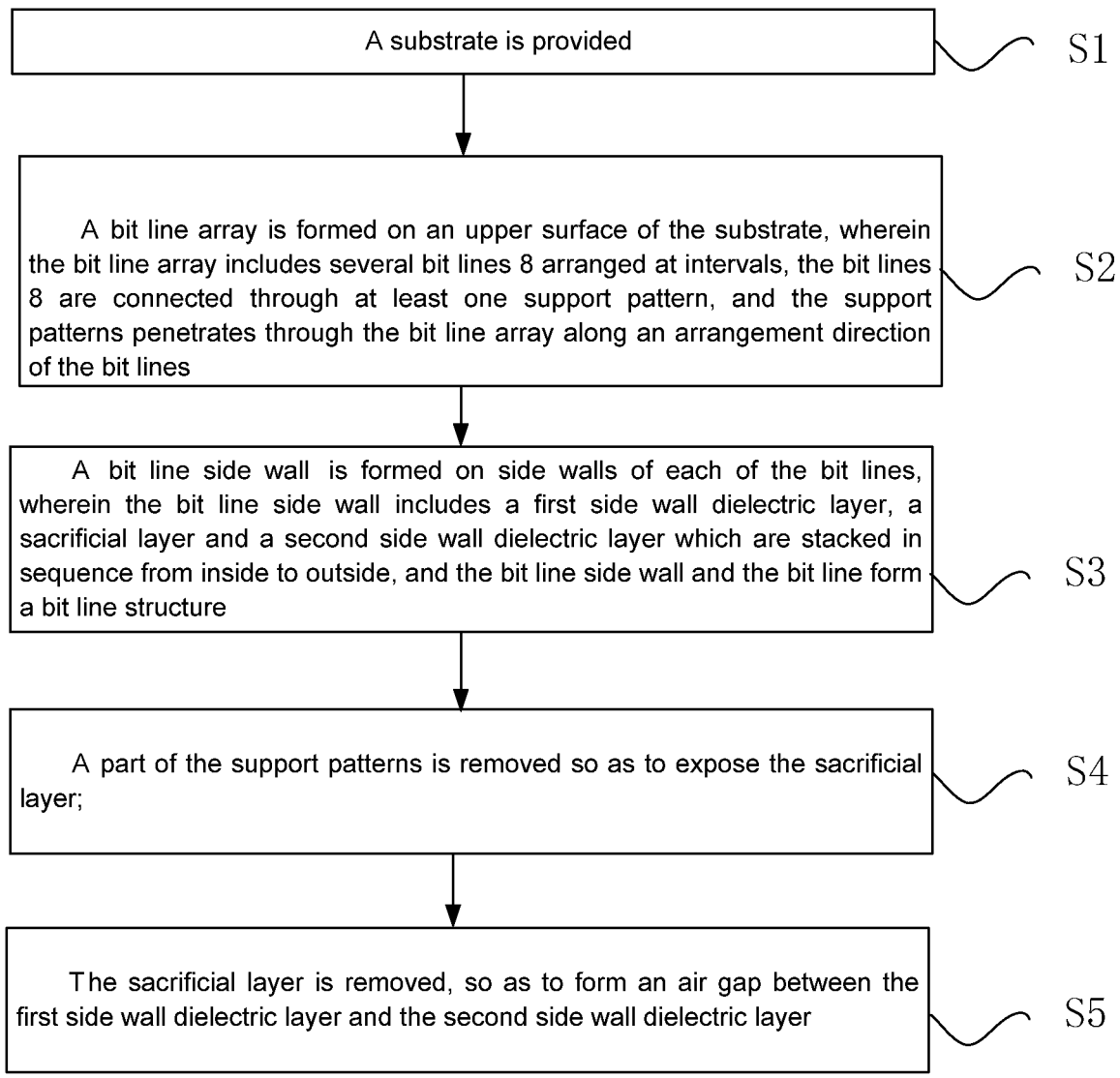
FIG. 1 is a flowchart of a method for manufacturing a semiconductor structure provided by some embodiments of the present disclosure.

1—substrate, 2—first conductive material layer, 3—second conductive material layer, 4—first dielectric material layer, 5—support pattern, 6—second dielectric material layer, 7—mask layer, 8—bit line, 9—bit line side wall, 91—first side wall dielectric layer, 92—sacrificial layer, 93—second side wall dielectric layer, 10—filling dielectric layer, 11—groove, 12—air gap, 13—support structure, 14—third dielectric material layer.

DETAILED DESCRIPTION OF THE EMBODIMENTS

In order to facilitate understanding of some embodiments of the present disclosure, some embodiments of the present disclosure will be described more fully hereinafter with reference to related accompanying drawings. Preferred embodiments of the present disclosure are shown in the accompanying drawings. However, some embodiments of the present disclosure may be implemented in many different forms, and are not limited to the embodiments described herein. Rather, the purpose of providing these embodiments is to make the disclosure content of the present disclosure more thorough and complete.

Unless defined otherwise, all technical and scientific terms used herein have the same meanings as those commonly understood by a person of ordinary skill in the art to which the present disclosure belongs. The terms used herein in the description of the present disclosure are for the purpose of describing particular embodiments only, and are not intended to limit some embodiments of the present disclosure.

It will be understood that when an element or layer is referred to as being "on . . . ", "adjacent to . . . ", "connected to" or "coupled to" other elements or layers, it can be directly on, adjacent to, connected to or coupled to the other elements or layers, or intermediate elements or layers may be present. In contrast, when an element is referred to as being "directly on . . . ", "directly adjacent to . . . ", "directly connected to" or "directly coupled to" other elements or layers, there are no intermediate elements or layers. It will be understood that although terms first, second, third, etc., may be used to describe various elements, components, regions, layers, doping types and/or portions, these elements, components, regions, layers, doping types and/or portions should not be limited by these terms. These terms are only used to distinguish one element, component, region, layer, doping type or portion from another element, component, region, layer, doping type or portion. Thus, a first element, component, region, layer, doping type or portion discussed below could be represented as a second element, component, region, layer or portion without departing from the teachings of some embodiments of the present disclosure. For example, a first side wall dielectric layer may be referred to as a second side wall dielectric layer, and similarly, a second side wall dielectric layer may be referred to as a first side wall dielectric layer; and the first side wall dielectric layer and the second side wall dielectric layer are different side wall dielectric layers.

Spatial relationship terms, such as "under . . . ", "below . . . ", "lower", "beneath . . . ", "above . . . ", "upper" etc., may be used herein to describe the relationship between one element or feature and other elements or features as shown in the drawings. It will be understood that in addition to the orientations shown in the drawings, the spatial relationship terms further comprise different orientations of a device in use and operation. For example, if a device in the drawings is turned over, elements or features described as "under" or "beneath" or "below" other elements would then be oriented "above" the other elements or features. Thus, the exemplary terms "below . . . " and "under . . . " may comprise both an upper orientation and a lower orientation. In addition, the device may comprise additional orientations (e.g., rotated by 90 degrees or other orientations), and spatial description phrases used herein are interpreted accordingly.

As used herein, the singular forms "a", "an", and "said/the" may comprise plural forms as well, unless the context clearly indicates otherwise. It will be further understood that the terms "composed of" and/or "comprise", when used in this description, can specify the presence of stated features, integers, steps, operations, elements, and/or components, but do not preclude the presence or addition of one or more other features, integers, steps, operations, elements, components, and/or groups. Also, as used herein, the term "and/or" comprises any and all combinations of the associated listed items.

Herein, embodiments of the disclosure are described with reference to cross-sectional diagrams as schematic diagrams of embodiments (and intermediate structures) of the present disclosure; in this way, variations in the shown shapes caused by for example, manufacturing techniques and/or tolerances may be contemplated. Accordingly, embodiments of the present disclosure should not be limited to the particular shapes of regions illustrated herein, but comprise deviations in shapes caused by for example, manufacturing techniques. For example, an implanted region shown to be a rectangle generally has rounded or curved features and/or implanted gradient concentrations at edges thereof, rather than a binary change from an implanted region to a non-implanted region. Likewise, a buried region formed by implantation may lead to some implantation in a region between the buried region and a passing surface when the implantation is performed. Therefore, the regions shown in the drawings are schematic in nature, their shapes are not represent actual shapes of the regions of a device, and do not limit the scope of some embodiments of the present disclosure.

Please refer to FIG. 1, some embodiments of the present disclosure provide a method for manufacturing a semiconductor structure, the method includes the following steps:

S1: a substrate 1 is provided;

S2: a bit line array is formed on an upper surface of the substrate 1, the bit line array includes several bit lines 8 arranged at intervals, the bit lines 8 are connected through at least one support pattern 5, and the support patterns 5 penetrates through the bit line array along an arrangement direction of the bit lines 8;

S3: a bit line side wall 9 is formed on side walls of each of the bit lines 8, the bit line side wall 9 includes a first side wall dielectric layer 91, a sacrificial layer 92 and a second side wall dielectric layer 93 which are stacked in sequence from inside to outside, and the bit line side wall 9 and the bit line 8 form a bit line structure (not shown);

S4: a part of the support patterns 5 is removed so as to expose the sacrificial layer 92; and S5: the sacrificial layer 92 is removed, so as to form an air gap 12 between the first side wall dielectric layer 91 and the second side wall dielectric layer 93.

According to the method for manufacturing the semiconductor structure in the described embodiment, the air gap 12 are formed between the first side wall dielectric layer 91 and the second side wall dielectric layer 93, so that the overall dielectric constant of interlayer dielectric layers can be decreased, thereby further can decrease the parasitic capacitance between the bit line structures, and improving the performance of the semiconductor device. Moreover, adjacent bit lines are connected through of the support patterns, which can function to support, optimize the problem that the bit lines are easy to bend or collapse, and prevent the bit lines from being inclined or collapsed when repeated cleaning is performed for multiple times, thereby increasing the depth-to-width ratio of the bit lines and facilitating the manufacture of a high-performance DRAM device.

As an example, the substrate 1 can include, but is not limited to, a silicon substrate; shallow trench isolation structures (not shown) can be formed in the substrate 1, and the shallow trench isolation structures isolate several active regions (not shown) distributed in an array in the substrate 1. Specifically, device structures, such as buried gate word lines (not shown), can also be formed in the substrate 1.

Figure 3:
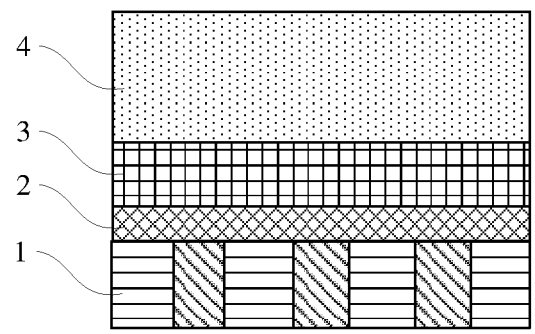
FIG. 3 is a schematic sectional view of a structure obtained in step S21 in the method for manufacturing the semiconductor structure provided by some embodiments of the present disclosure.
Figure 4:
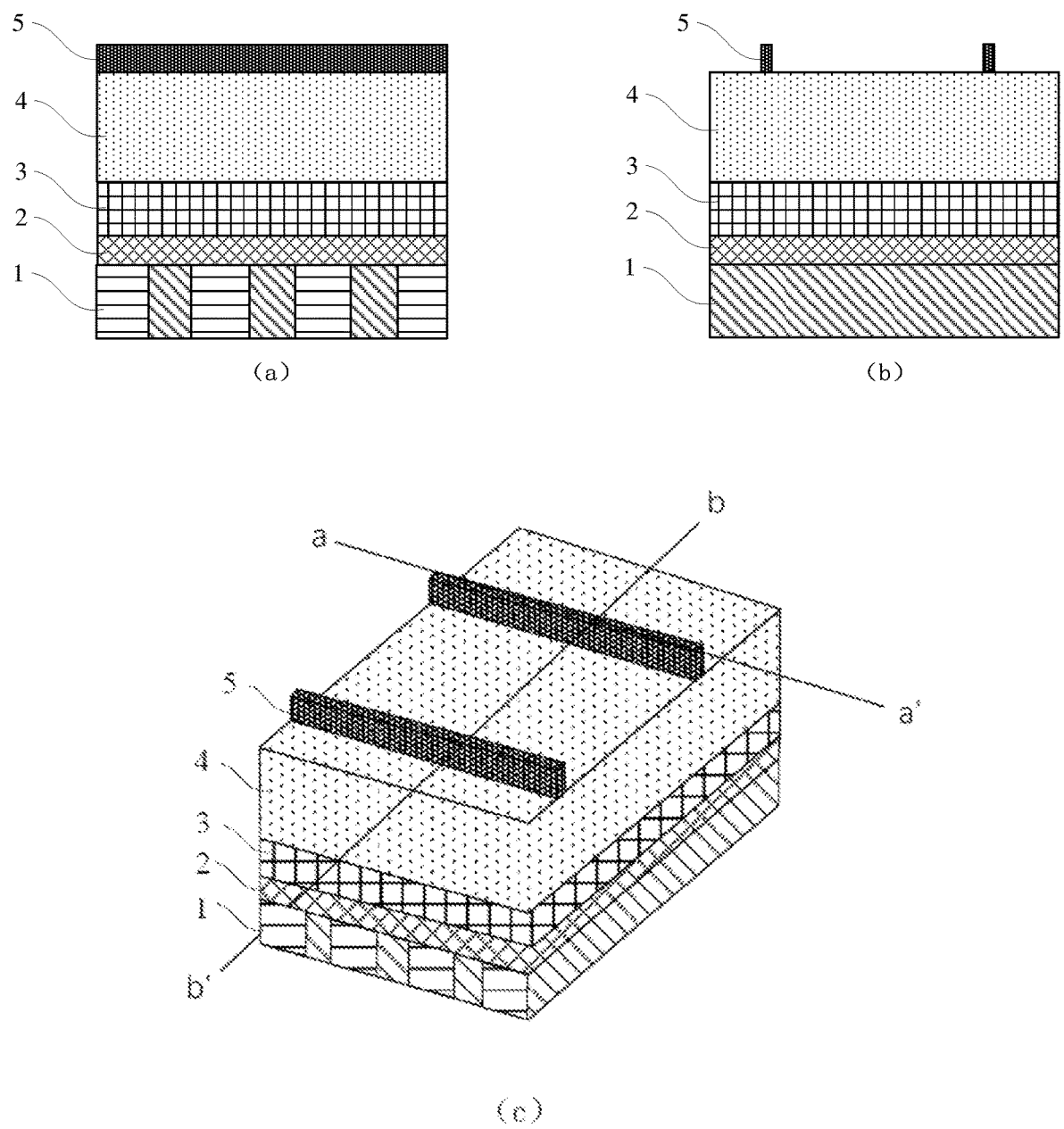
FIG. 4 is a schematic sectional view of a structure obtained in step S22 in the method for manufacturing the semiconductor structure provided by some embodiments of the present disclosure; wherein figure (c) in FIG. 4 is a perspective view of the structure obtained in step S22, figure (a) in FIG. 4 is a schematic sectional view of figure (c) in FIG. 4 along an aa' direction, and figure (b) in FIG. 4 is a schematic sectional view of figure (c) in FIG. 4 along a bb' direction.
Figure 5:
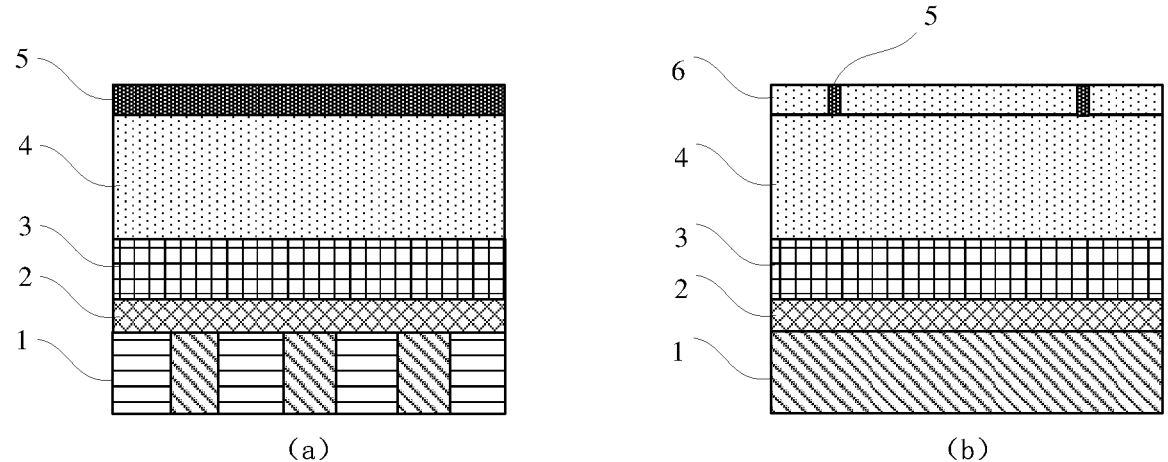
FIG. 5 is a schematic sectional view of a structure obtained in step S23 in the method for manufacturing the semiconductor structure provided by some embodiments of the present disclosure; wherein figure (a) in FIG. 5 is a schematic sectional view of the structure obtained in step S23 along the aa' direction in figure (c) in FIG. 4, and figure (b) in FIG. 5 is a schematic sectional view of the structure obtained in step S23 along the bb' direction in figure (c) in FIG. 4.

In some embodiments, please refer to step S2 of FIG. 1 and FIGS. 2-7, step S2 specifically includes the following steps:

S21: as shown in FIG. 3, on the upper surface of the substrate 1, a first conductive material layer 2, a second conductive material layer 3 and a first dielectric material layer 4 which are stacked in sequence from bottom to top are formed; specifically, the first conductive material layer 2, the second conductive material layer 3 and the first dielectric material layer 4 can be formed by using but not limited to a deposition process; and the first conductive material layer 2 can include, but is not limited to, a titanium nitride layer, the second conductive material layer 3 can include, but is not limited to, a tungsten layer, and the first dielectric material layer 4 can include, but is not limited to, a silicon nitride layer;

S22: as shown in figure (a) in FIG. 4 and figure (b) in FIG. 4, support patterns 5 are formed on an upper surface of the first dielectric material layer 4, each of the support patterns 5 extending along a first direction;

S23: as shown in figure (a) in FIG. 5 and figure (b) in FIG. 5, a second dielectric material layer 6 is formed on the upper surface of the first dielectric material layer 4, the second dielectric material layer 6 can include, but are not limited to, a silicon nitride layer; and S24: etching the second dielectric material layer 6, the first dielectric material layer 4, the second conductive material layer 3 and the first conductive material layer 2, so as to form the bit line array, the bit line array includes several bit lines 8 arranged at intervals, each of the bit lines 8 extends along a second direction, and the second direction intersects with the first direction, and the support patterns 5 penetrate through the bit line array.

Figure 6:
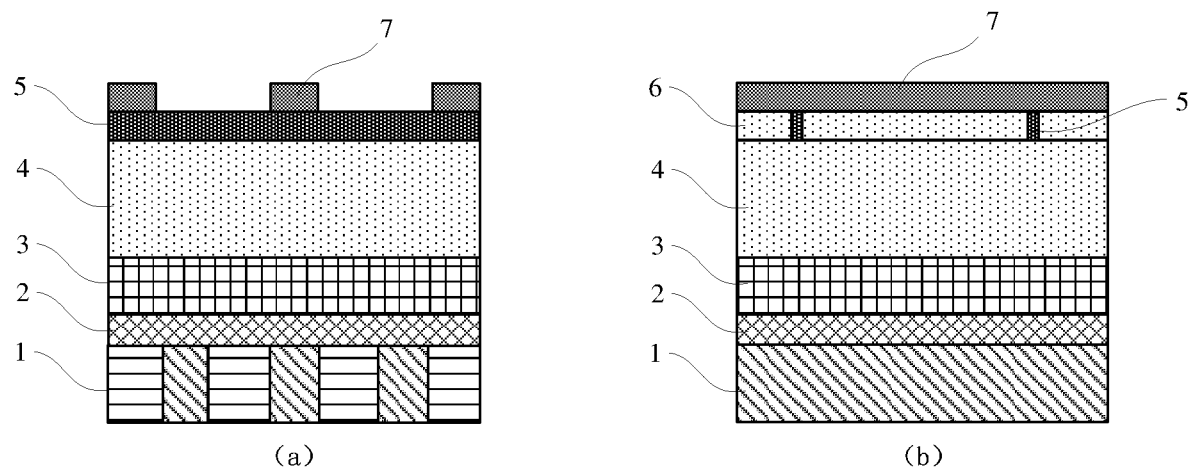
FIG. 6 is a schematic sectional view of a structure obtained in a step of forming a mask layer on an upper surface of each of at least one support pattern and an upper surface of a second dielectric material layer in the method for manufacturing the semiconductor structure provided by some embodiments of the present disclosure; wherein figure (a) in FIG. 6 is a schematic sectional view of the structure obtained in the step of forming the mask layer on the upper surface of each of at least one support pattern and the upper surface of the second dielectric material layer along the aa' direction in figure (c) in FIG. 4, and figure (b) in FIG. 6 is a schematic sectional view of the structure obtained in the step of forming the mask layer on the upper surface of each of at least one support pattern and the upper surface of the second dielectric material layer along the bb' direction in figure (c) in FIG. 4.
Figure 7:
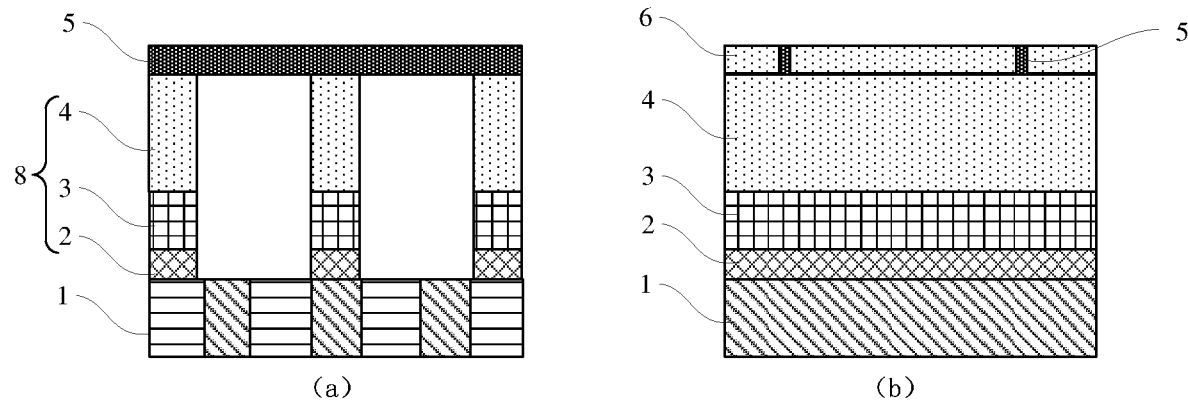
FIG. 7 is a schematic sectional view of a structure obtained in step S24 in the method for manufacturing the semiconductor structure provided by some embodiments of the present disclosure; wherein figure (a) in FIG. 7 is a schematic sectional view of the structure obtained in step S24 along the aa' direction in figure (c) in FIG. 4, and figure (b) in FIG. 7 is a schematic sectional view of the structure obtained in step S24 along the bb' direction in figure (c) in FIG. 4.

Specifically, in some embodiments, please refer to FIGS. 6 to 7, step S24 specifically includes the following steps:

as shown in figure (a) in FIG. 6 and figure (b) in FIG. 6, mask layers 7 is formed on an upper surface of the support patterns 5 and an upper surface of the second dielectric material layer 6, the mask layer 7 defines the shapes and positions of the bit lines; and as shown in figure (a) in FIG. 7 and figure (b) in FIG. 7, the mask layers 7 is removed, and the second dielectric material layer 6, the first dielectric material layer 4, the second conductive material layer 3 and the first conductive material layer 2 are etched, so as to form the bit line array.

The material of the support patterns 5 can include, but is not limited to, any one or more of silicon carbonitride, silicon carbide, gallium nitride, etc., and the material of the support patterns 5 is not limited in some embodiments of the present disclosure. Specifically, in this embodiment, the material of the support patterns 5 includes, but is not limited to silicon carbonitride.

In some embodiments, a width of each of the support patterns 5 can be ½ to 1 times a width of the bit lines 8. Specifically, the width of the support patterns 5 can be ½, ⅔, ¾ or 1 times the width of each of the bit lines 8. It can be understood that the data above is only examples, and in practical embodiments, the width of each of the support patterns 5 is not limited to the data above.

Figure 8:
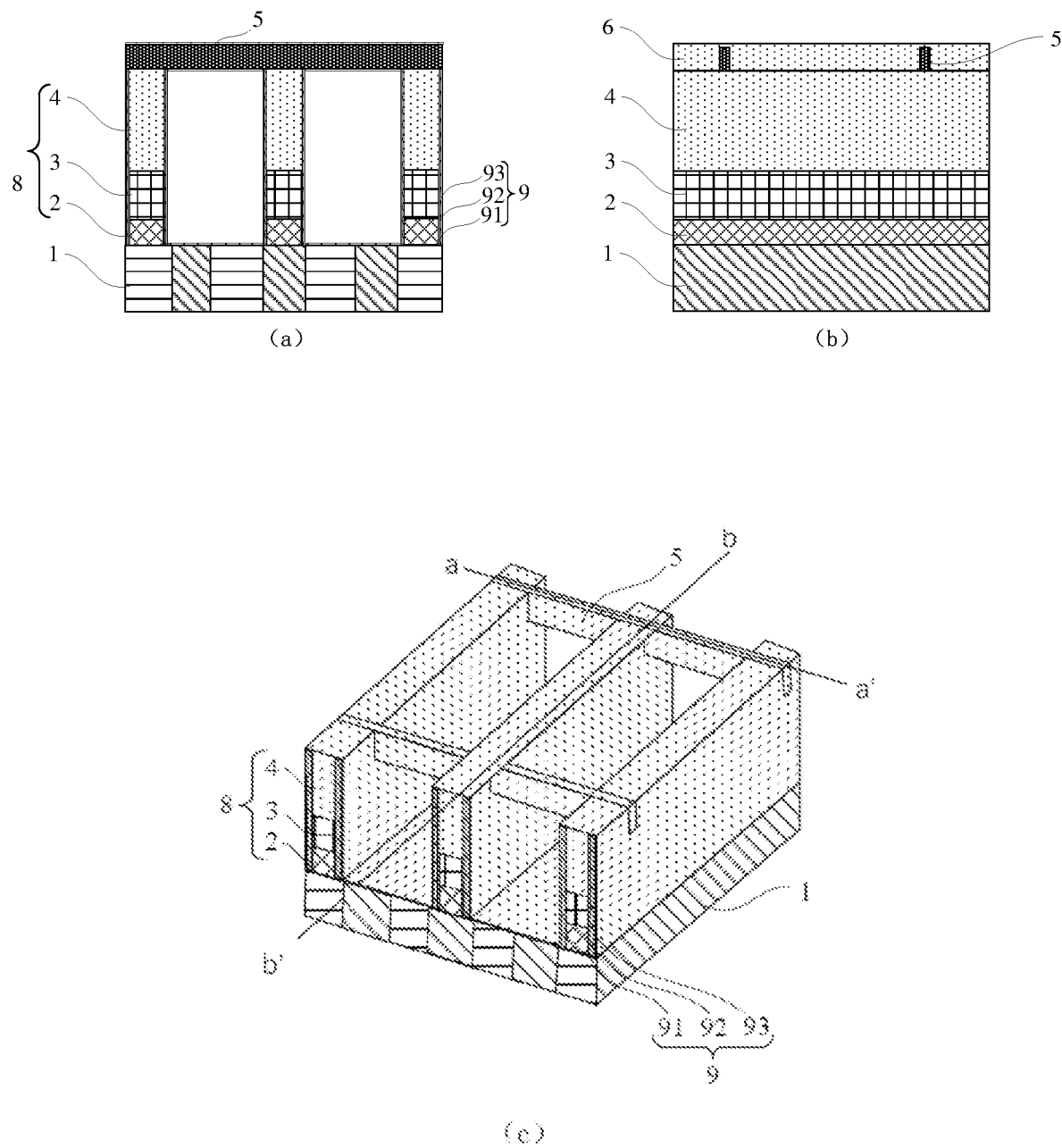
FIG. 8 is a schematic sectional view of a structure obtained in step S3 in the method for manufacturing the semiconductor structure provided by some embodiments of the present disclosure; wherein figure (c) in FIG. 8 is a perspective view of the structure obtained in step S3, figure (a) in FIG. 8 is a schematic sectional view of figure (c) in FIG. 8 along the aa' direction, and figure (b) in FIG. 8 is a schematic sectional view of figure (c) in FIG. 8 along the bb' direction.

Step S3 is described in more detail below. In some embodiments, please refer to figure (a) in FIG. 8, figure (b) in FIG. 8 and figure (c) in FIG. 8, step S3 includes: the bit line side wall 9 is formed on side walls of each of the bit lines 8, the bit line side wall 9 includes the first side wall dielectric layer 91, the sacrificial layer 92 and the second side wall dielectric layer 93 which are stacked in sequence from inside to outside, and the bit line side wall 9 and the bit line 8 form the bit line structure (not shown).

Materials of the first side wall dielectric layer 91 and the second side wall dielectric layer 93 can include, but are not limited to, any one or more of silicon nitride, silicon or polyimide, and the materials of the first side wall dielectric layer 91 and the second side wall dielectric layer 93 are not limited in some embodiments of the present disclosure; specifically, in this embodiment, the first side wall dielectric layer 91 and the second side wall dielectric layer 93 include silicon nitride layers.

Material of the sacrificial layer 92 can include, but is not limited to, any one or more of silicon oxide, polysilicon or photoresist, and the material of the sacrificial layer 92 is not limited in some embodiments of the present disclosure. Specifically, in this embodiment, the sacrificial layer 92 includes a silicon oxide layer.

It can be understood that in some embodiments, before air gaps 12 are formed, the bit lines 8 can be connected by means of the support patterns 5, and then the bit line side wall 9 is formed on the side walls of each of the bit lines 8. The bit line side wall 9 includes the first side wall dielectric layer 91, the second side wall dielectric layer 93, and the sacrificial layer 92 between the first side wall dielectric layer 91 and the second side wall dielectric layer 93. Thus, no bit line side walls 9 are deposited on parts, corresponding to the support patterns 5, on the side walls of the bit lines, and therefore when the sacrificial layer 92 is subsequently removed to form the air gaps 12, no air gaps 12 are formed on the parts, corresponding to the support patterns 5, on the side walls of the bit lines.

Figure 9:
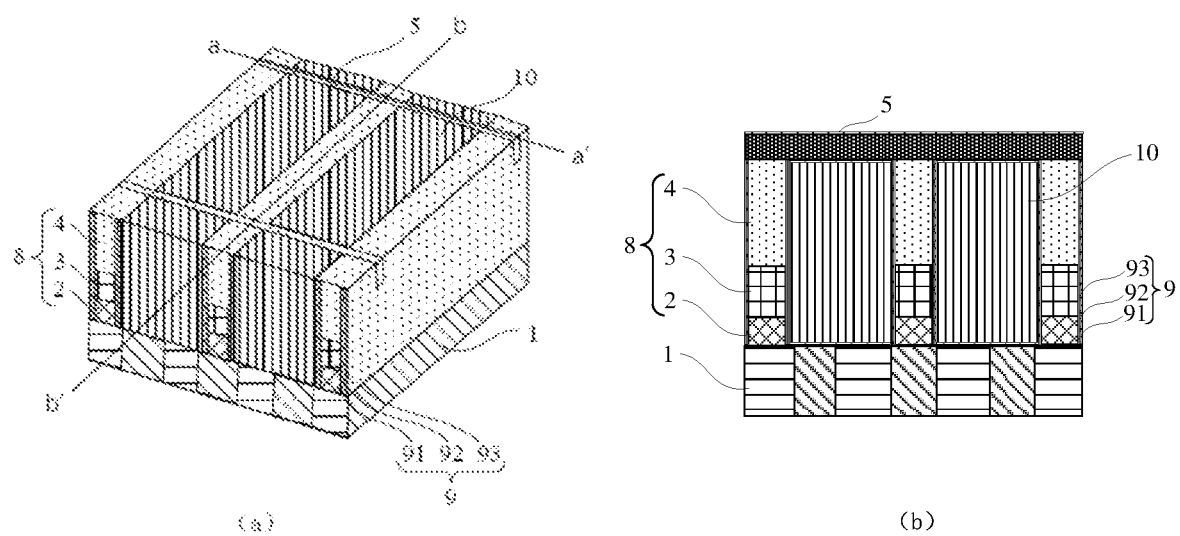
FIG. 9 is a schematic diagram of a structure obtained in a step of forming a filling dielectric layer between adjacent bit line structures in the method for manufacturing the semiconductor structure provided by some embodiments of the present disclosure; figure (a) in FIG. 9 is a perspective view of the structure obtained in the step of forming the filling dielectric layer between adjacent bit line structures, and figure (b) in FIG. 9 is a schematic sectional view of figure (a) in FIG. 9 along the aa' direction.

Please refer to figure (a) in FIG. 9 and figure (b) in FIG. 9, in some embodiments, after step S3, the method further includes the following steps:

a filling dielectric layers 10 is formed between two adjacent bit line structures, an upper surface of the filling dielectric layer 10 is flush with an upper surface of the bit line structure. It should be noted that the filling dielectric layer 10 can also be formed after the support structures 13 are removed subsequently.

Figure 10:
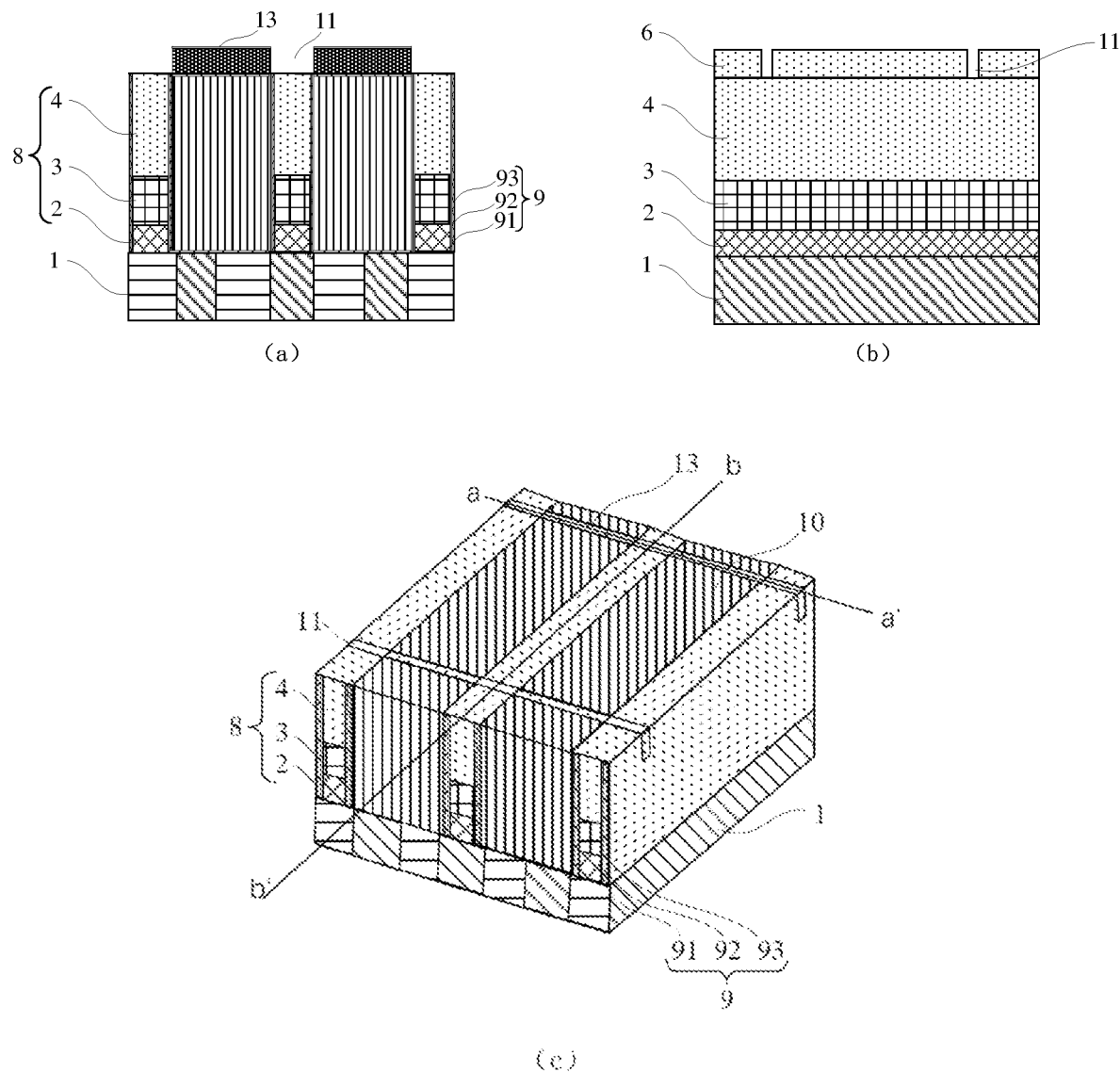
FIG. 10 is a schematic sectional view of a structure obtained in step S4 in the method for manufacturing the semiconductor structure provided by some embodiments of the present disclosure; wherein figure (c) in FIG. 10 is a perspective view of the structure obtained in step S4, figure (a) in FIG. 10 is a schematic sectional view of figure (c) in FIG. 10 along the aa' direction, and figure (b) in FIG. 10 is a schematic sectional view of figure (c) in FIG. 10 along the bb' direction.

Please refer to figure (a) in FIG. 10, figure (b) in FIG. 10, and figure (c) in FIG. 10, in the described embodiment, step S4 includes the following step:

grooves 11 are formed in the support patterns 5, each of the grooves 11 exposes a part of the sacrificial layer 92.

In other embodiments, step S4 further included the following step:

the support patterns 5 are thinned, so as to expose the sacrificial layer 92 of the bit line structure.

In some embodiments, the support patterns 5 can be partially thinned; in other embodiments, the each of the support pattern 5 can also be completely removed, so as to expose the sacrificial layer 92 of the bit line structure to the greatest extent; it is not specifically limited in this embodiment.

In some embodiments, a step of forming the grooves 11 in the support patterns 5 includes the following steps:

parts of the support patterns 5 right above the bit line structures are removed, so as to form the grooves 11; the support patterns retaining between adjacent bit line structures are support structures.

In other embodiments, the groove 11 can expose only a sacrificial layer 92 on one side wall of the bit line structure, and a length of the groove 11 in an extension direction of the support structures 13 can be less than the width of each of the bit lines.

In the embodiments above, step S5 can include the following step:

based on the grooves 11, the sacrificial layers 92 are removed by wet etching.

Figure 11:
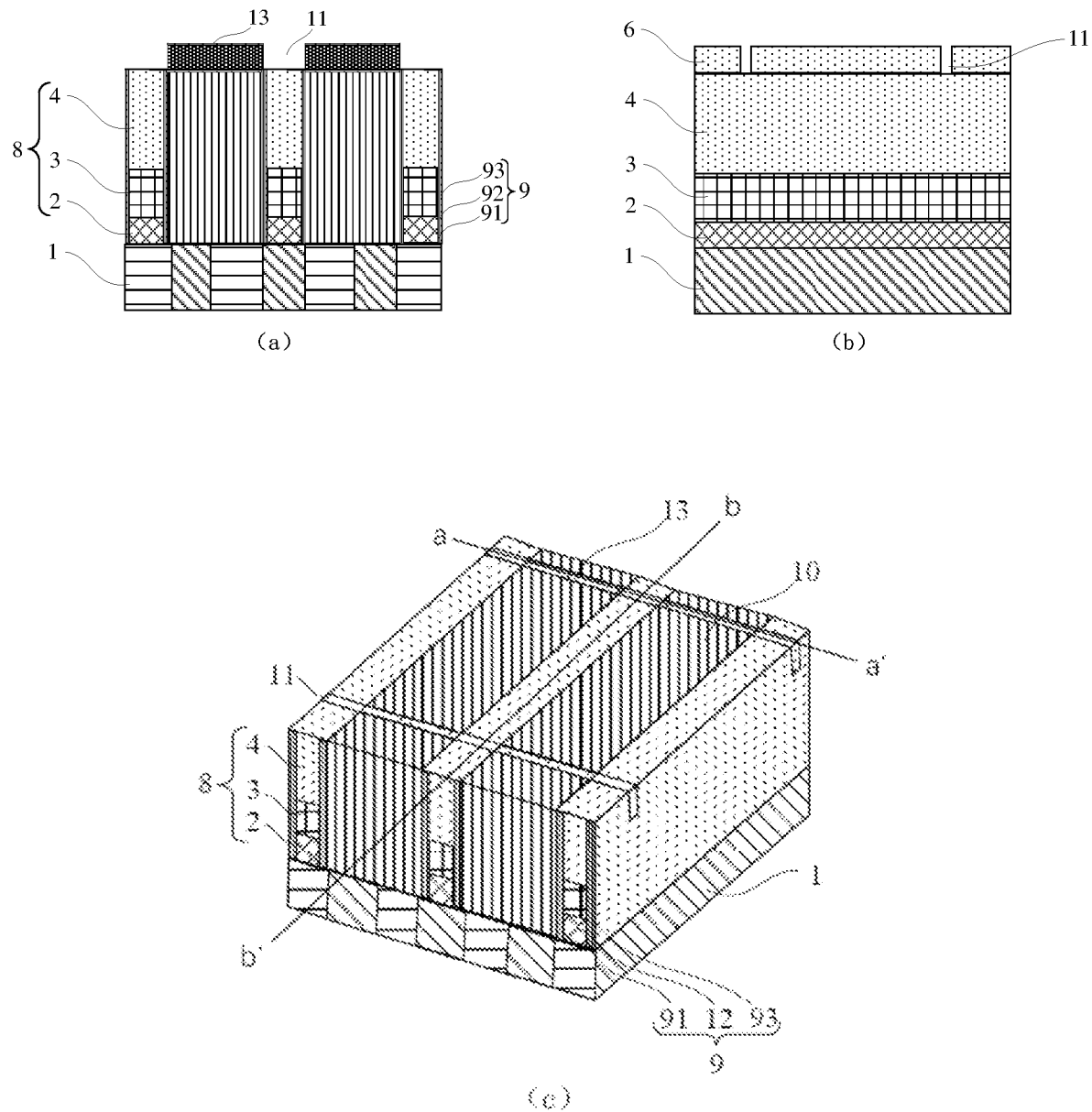
FIG. 11 is a schematic sectional view of a structure obtained in step S5 in the method for manufacturing the semiconductor structure provided by some embodiments of the present disclosure; wherein figure (c) in FIG. 11 is a perspective view of the structure obtained in step S5 figure (a) in FIG. 11 is a schematic sectional view of figure (c) in FIG. 11 along the aa' direction, and figure (b) in FIG. 11 is a schematic sectional view of figure (c) in FIG. 11 along the bb' direction.

Step S5 is described in more detail below. Please refer to figure (a) in FIG. 11, figure (b) in FIG. 11, and figure (c) in FIG. 11, in some embodiments, step S5 specifically includes: the sacrificial layers 92 are removed, so as to form air gaps 12 between the first side wall dielectric layers 91 and the second side wall dielectric layers 93.

Figure 12:
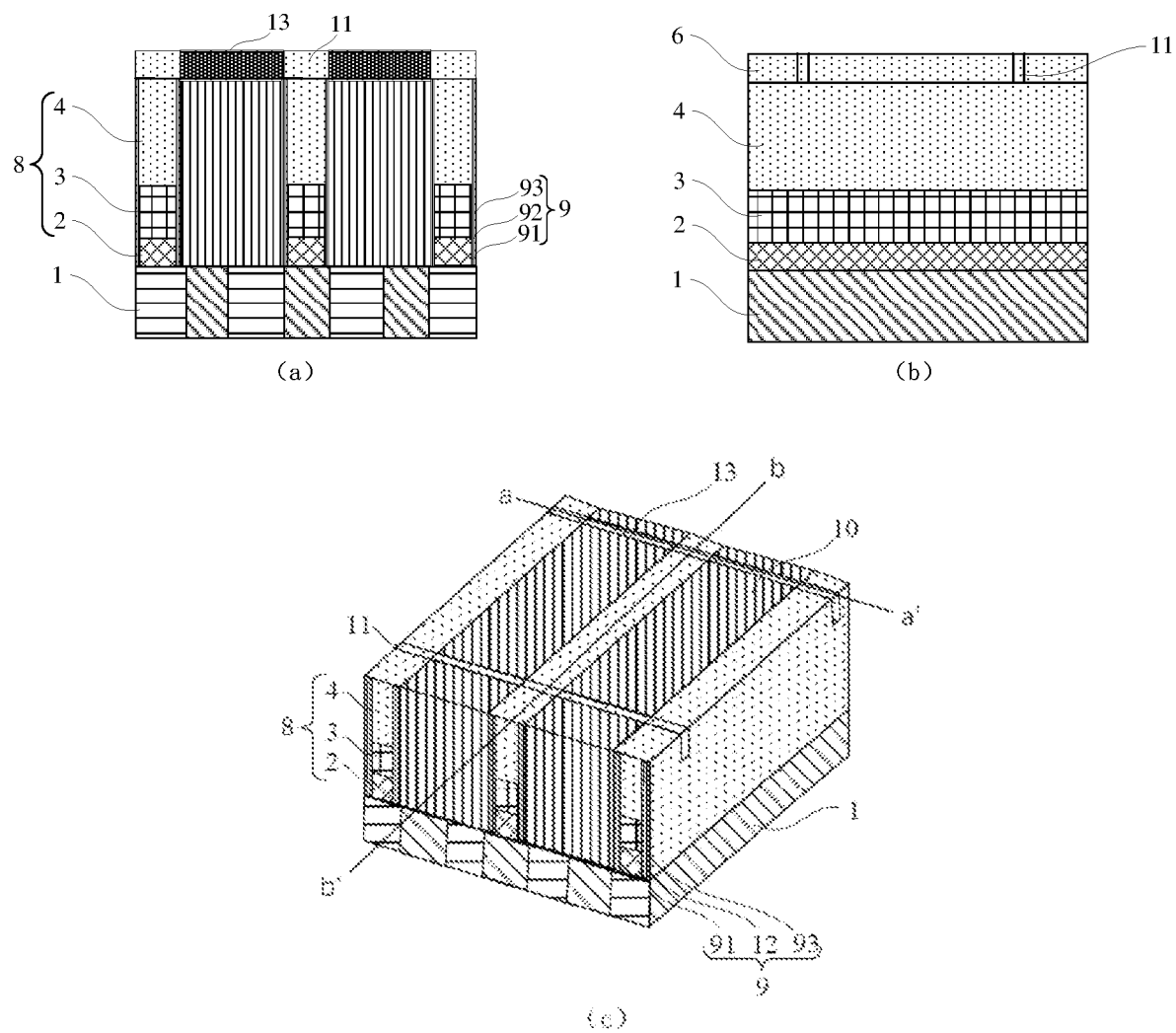
FIG. 12 is a perspective view of a structure obtained in a step of forming a third dielectric material layer in each of grooves in the method for manufacturing the semiconductor structure provided by some embodiments of the present disclosure.

Please refer to FIG. 12, in some embodiments, after step S5, the method further includes the following step:

a third dielectric material layer 14 is formed in each of the grooves 11, an upper surface of the third dielectric material layers 14 is flush with an surface of the second dielectric material layer 6 away from the first dielectric material layer 4.

Specifically, in some embodiments, the third dielectric material layer 14 can be formed in each of the grooves 11 by using, but not limited to, an atomic layer deposition process; in other embodiments, other deposition processes such as physical vapor deposition or chemical vapor deposition can also be used to form the third dielectric material layer 14 in each of the grooves 11, which is not specifically limited in the present disclosure. The third dielectric material layer 14 can include, but are not limited to, a silicon nitride layer.

In some embodiments, a deposition temperature for forming the third dielectric material layer 14 can include, but is not limited to, 500° C. to 700° C.; specifically, the deposition temperature for forming the third dielectric material layer 14 can be 500° C., 550° C., 600° C., 650° C. or 700° C., etc. It can be understood that the data above is merely examples, and in practical embodiments, the deposition temperature for forming the third dielectric material layer 14 is not limited to the data above.

Figure 13:
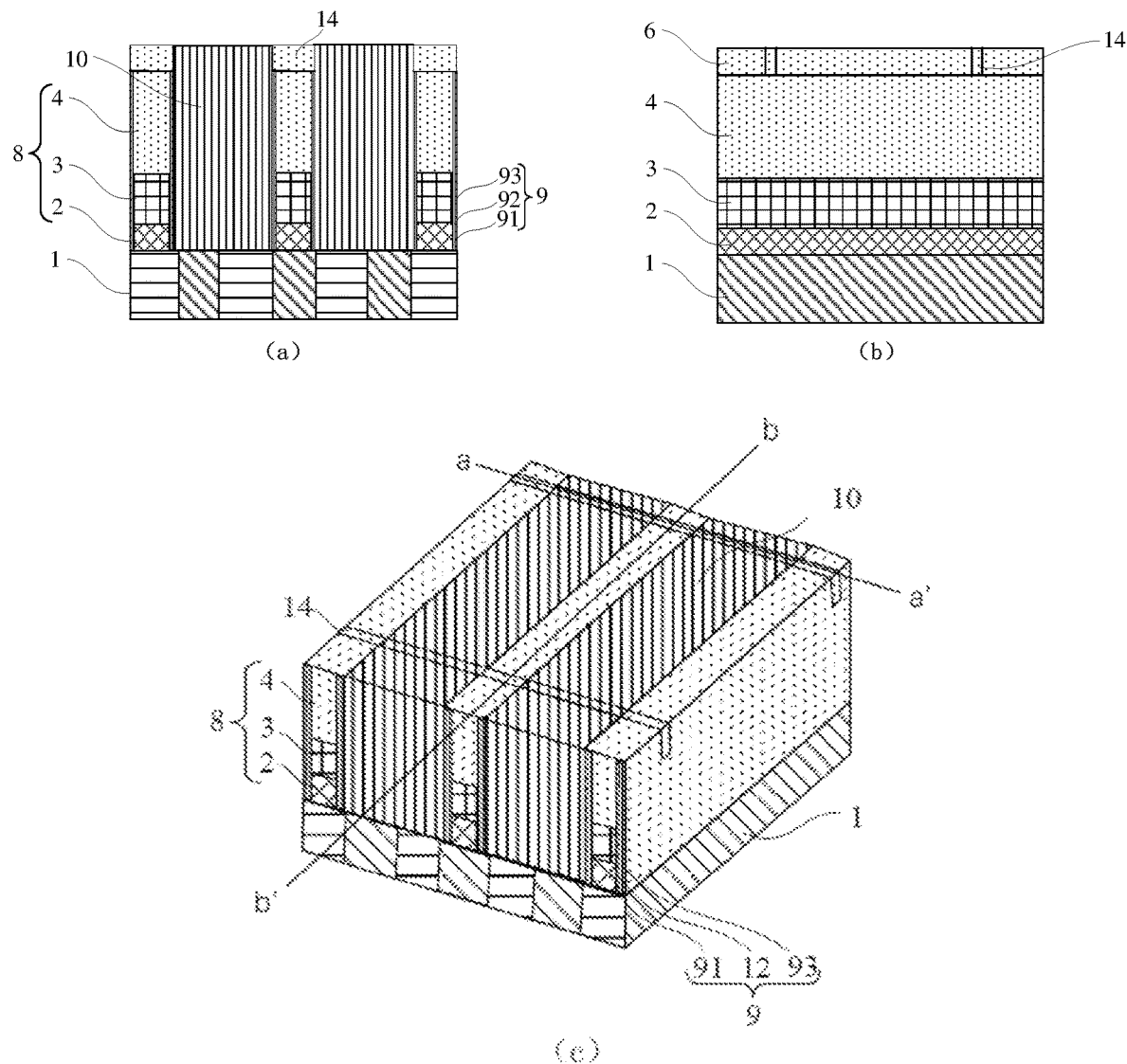
FIG. 13 is a schematic diagram of a structure obtained in a step of removing support structures in the method for manufacturing the semiconductor structure provided in some embodiments of the present disclosure, and is also a schematic diagram of a semiconductor structure provided in some embodiments of the present disclosure; wherein figure (c) in FIG. 13 is a perspective view of the structure obtained in the step of removing the support structures, figure (a) in FIG. 13 is a schematic sectional view of figure (c) in FIG. 13 along the aa' direction, and figure (b) in FIG. 13 is a schematic sectional view of figure (c) in FIG. 13 along the bb' direction.

Please refer to figure (a) in FIG. 13, figure (b) in FIG. 13, and figure (c) in FIG. 13, in some embodiments, after forming the third dielectric material layer 14 in each of the grooves 11, the method further includes the following step:
the support structures 13 are removed. It should be noted that after the support structures 13 are removed, pits (not shown in FIG. 13) corresponding to the support structures 13 are formed at t tops of the third dielectric material layers 14, and in this case, the pits can be filled up by depositing dielectric material layers.

Please continue to refer to figure (a) in FIG. 13, figure (b) in FIG. 13, and figure (c) in FIG. 13, some embodiments of the present disclosure further provide a semiconductor structure, the semiconductor structure includes:
a substrate 1;
several bit lines 8 arranged in parallel at intervals, each of the bit lines 8 extends along a second direction; and
bit line side walls 9, each of the bit line side walls locates on side walls of one of the bit lines 8, and each of the bit line side walls includes a first side wall dielectric layer 91, an air gap 12 and a second side wall dielectric layer 93 which are stacked in sequence from inside to outside; each of the bit line side walls 9 and one of the bit lines 8 together constitute a bit line structure; and
recesses, each of the recesses is formed on an upper edge of the air gap 12 (not shown in the drawings).

The semiconductor structure provided in the described embodiments has air gap between conductive materials, and the air gap can decrease the parasitic capacitance between the bit line structures, and therefore the semiconductor structure has better performances.

As an example, the substrate 1 can include, but is not limited to, a silicon substrate; shallow trench isolation structures (not shown) can be formed in the substrate 1, and the shallow trench isolation structures isolate several active regions (not shown) distributed in an array in the substrate 1. Specifically, device structures, such as buried gate word lines (not shown), can also be formed in the substrate 1.

Please continue to refer to figure (a) in FIG. 13, figure (b) in FIG. 13, and figure (c) in FIG. 13, in some embodiments, each of the at least one air gap 12 includes a first gap segment (not shown) and a second gap segment (not shown), s height of the first gap segment in a direction perpendicular to the substrate 1 is greater than a height of each second gap segment in the direction perpendicular to the substrate 1;
each of the bit lines 8 includes a first conductive material layer 2, a second conductive material layer 3 and a first dielectric material layer 4 which are stacked in sequence from bottom to top; and
the semiconductor structure further includes second dielectric material layers 6 and third dielectric material layers 14, each of the second dielectric material layers 6 cover an upper surface, corresponding to the first gap segment, of one of the bit lines 8, and each of the third dielectric material layers 14 cover an upper surface, corresponding to the second gap segment, of one of the bit lines 8.

It can be understood that upper edges of the first gap segments and the second gap segments together form upper edges of the air gaps 12, and the upper edges of the second gap segments correspond to the recesses formed on the upper edges of the air gaps 12.

As an example, the first conductive material layer 2 can include, but is not limited to, a titanium nitride layer, the second conductive material layer 3 can include, but is not limited to, a tungsten layer, and the first dielectric material layer 4 can include, but is not limited to, a silicon nitride layer.

In some embodiments, please continue to refer to FIG. 12, the semiconductor structure further includes support structures 13, located between adjacent bit line structures and connected to adjacent bit lines 8.

The semiconductor structure provided in the described embodiments has support structures 13. Adjacent bit lines are connected by means of the support structures, which can function to support, so that the semiconductor structure has good structural stability, and is able to optimize the problem that the bit lines are easy to bend or collapse, and prevent the bit lines from being inclined or collapsed when repeated cleaning is performed for multiple times, thereby increasing the depth-to-width ratio of the bit lines and facilitating the preparation of a high-performance DRAM device.

Specifically, in some embodiments, there are multiple support structures 13 between adjacent bit line structures, and the multiple support structures 13 located between adjacent bit lines 8 are arranged at intervals. The material of the support structures 13 can include, but is not limited to, any one or more of silicon carbonitride, silicon carbide, gallium nitride, etc., and the material of the support structures 13 is not limited in some embodiments of the present disclosure. Specifically, in this embodiment, the material of the support structures 13 includes, but is not limited to silicon carbonitride.

In some embodiments, a width of each of the support structures 13 can be ½ to 1 times a width of each of the bit lines 8. Specifically, the width of the support structures 13 can be ½, ⅔, ¾ or 1 times of the width of the bit lines 8. It can be understood that the data above is only examples, and in practical embodiments, the width of the support patterns 5 is not limited to the data above.

Materials of the first side wall dielectric layers 91 and the second side wall dielectric layers 93 can include, but are not limited to, any one or more of silicon nitride, silicon or polyimide, and the materials of the first side wall dielectric layers 91 and the second side wall dielectric layers 93 are not limited in some embodiments of the present disclosure; specifically, in this embodiment, the first side wall dielectric layers 91 and the second side wall dielectric layers 93 include silicon nitride layers.

As an example, a filling dielectric layer 10 is formed between two adjacent bit line structures, and an upper surface of the filling dielectric layer 10 is flush with an upper surface of the bit line structure.

Figure 2:
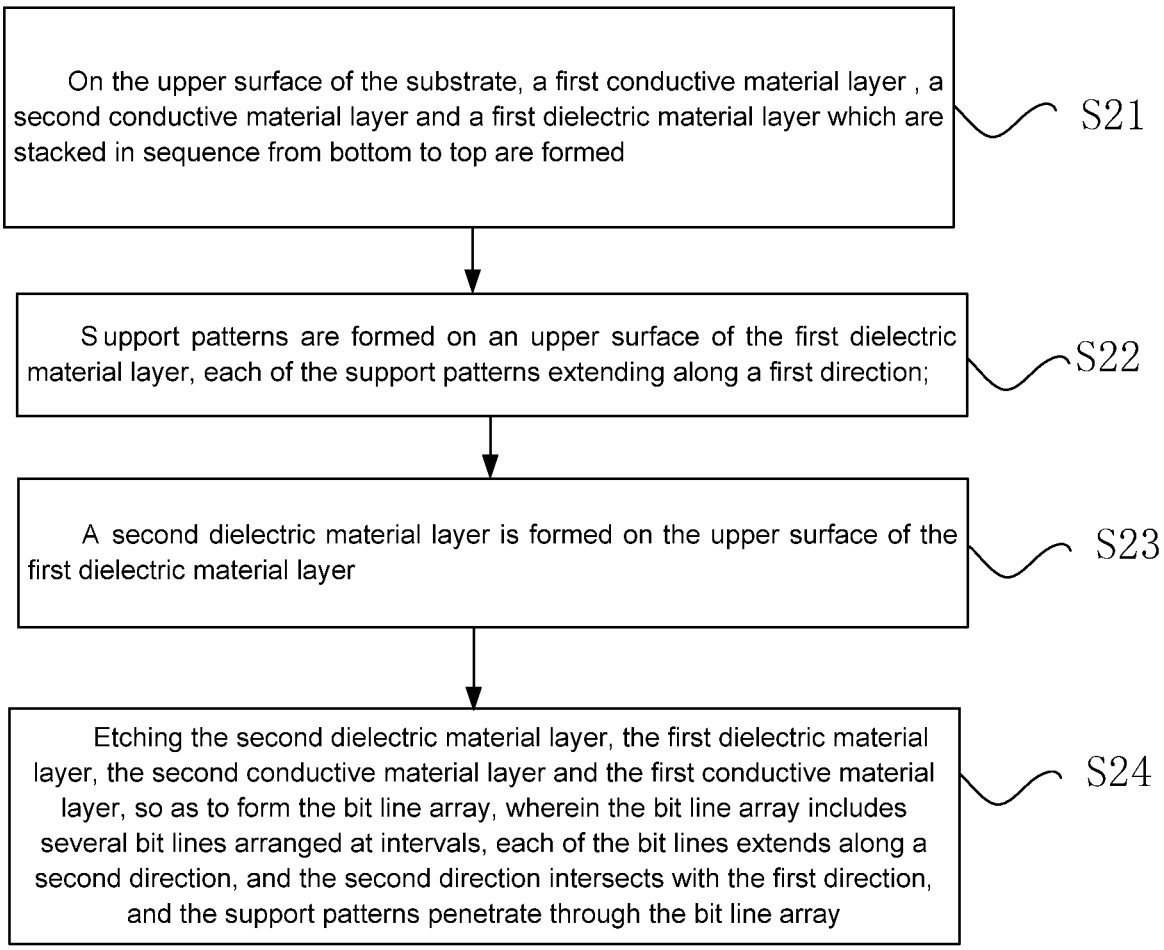
FIG. 2 is a flowchart of step S2 in the method for manufacturing the semiconductor structure provided by some embodiment of the present disclosure.

It should be understood that although the steps in the flowcharts of FIG. 1 and FIG. 2 are displayed in sequence as indicated by the arrows, these steps are not necessarily executed in sequence as indicated by the arrows. Unless explicitly specified herein, these steps are not performed in strict sequence, and these steps can be performed in other sequences. Furthermore, at least a part of the steps in FIG. 1 and FIG. 2 can include a plurality of steps or a plurality of stages. These steps or stages are not necessarily executed at the same time, but can be executed at different times. The execution sequence of these steps or stages is not necessarily executed in sequence, and can be executed in turn or alternately with at least a part of the other steps, or steps or stages of other steps.

Various technical features of the described embodiments can be combined in any way, and in order to make the description brief, all possible combinations of the technical features of the described embodiments are not described. However, as long as the combination of these technical features is not contradictory, all of the technical features should be considered to belong to the scope of the description.

The embodiments above merely represent several embodiments of the present disclosure, and the description thereof is specific and detailed, but the specific and detailed description cannot be understood as limiting the patent scope of some embodiments of the present disclosure. It should be noted that for a person of ordinary skill in the art, several modifications and improvements can be made without departing from the concept of some embodiments of the present disclosure, and all these modifications and improvements belong to the scope of protection of some embodiments of the present disclosure. Therefore, the scope of protection of the present application patent shall be subject to the appended claims.

What is claimed is:

1. A method for manufacturing a semiconductor structure, comprising:
    providing a substrate;
    forming a bit line array on an upper surface of the substrate, wherein the bit line array comprises a plurality of bit lines arranged in parallel at intervals, the bit lines are connected through at least one support pattern, the at least one support pattern crosses through the bit line array along an arrangement direction of the bit lines, each of the at least one support pattern extends along a first direction, and each of the bit lines extends along a second direction;
    forming a bit line side wall on side walls of each of the bit lines, wherein the bit line side wall comprises a first side wall dielectric layer, a sacrificial layer and a second side wall dielectric layer which are stacked in sequence, and the bit line side wall and the bit lines constitute a plurality of bit line structures;
    forming a filling dielectric layer between two adjacent bit line structures of the bit line structures, an upper surface of the filling dielectric layer being flush with upper surfaces of the bit line structures;
    forming at least one groove in the at least one support pattern, the at least one groove exposing the sacrificial layer, wherein the sacrificial layer comprises at least one recess at an upper edge of the sacrificial layer; and
    based on the at least one groove, removing the sacrificial layer by wet etching to form an air gap between the first side wall dielectric layer and the second side wall dielectric layer, wherein the air gap comprises the at least one recess at an upper edge of the air gap.

2. The method for manufacturing the semiconductor structure according to claim 1, wherein forming the bit line array on the upper surface of the substrate comprises:
    forming, on the upper surface of the substrate, a first conductive material layer, a second conductive material layer and a first dielectric material layer which are stacked in sequence from bottom to top;
    forming the at least one support pattern on an upper surface of the first dielectric material layer;
    forming a second dielectric material layer on the upper surface of the first dielectric material layer; and
    etching the second dielectric material layer, the first dielectric material layer, the second conductive material layer and the first conductive material layer, so as to form the bit line array, wherein the second direction intersects with the first direction.

3. The method for manufacturing the semiconductor structure according to claim 2, wherein forming the at least one groove in the at least one support pattern comprises:
    removing parts of the at least one support pattern right above the bit line structures, so as to form the at least one groove, wherein a portion of the at least one support pattern retained between adjacent bit line structures of the bit line structures are support structures.

4. The method for manufacturing the semiconductor structure according to claim 3, wherein after removing the sacrificial layer to form the air gap between the first side wall dielectric layer and the second side wall dielectric layer, the method further comprises:
    forming a third dielectric material layer in each of the at least one groove, an upper surface of the third dielectric material layer being flush with an upper surface of the second dielectric material layer.

5. The method for manufacturing the semiconductor structure according to claim 4, wherein forming the third dielectric material layer in each of the at least one groove comprises:
    forming the third dielectric material layer in each of the at least one groove by an atomic layer deposition process, wherein a deposition temperature for forming the third dielectric material layer is 500° C. to 700° C.

6. The method for manufacturing the semiconductor structure according to claim 4, wherein after forming the third dielectric material layer in each of the at least one groove, the method further comprises:
    removing the support structures.

7. The method for manufacturing the semiconductor structure according to claim 1, wherein the first side wall dielectric layer and the second side wall dielectric layer respectively comprise a silicon nitride layer, the sacrificial layer comprises a silicon oxide layer, and a material of the at least one support pattern comprises silicon carbonitride.

8. The method for manufacturing the semiconductor structure according to claim 1, wherein a width of each of the at least one support pattern is ½ to 1 times a width of each of the bit lines.

9. The method for manufacturing the semiconductor structure according to claim 1, wherein the at least one recess at the upper edge of the sacrificial layer is defined by the at least one support pattern.

* * * * *